United States Patent
Jang

(10) Patent No.: US 11,323,100 B1
(45) Date of Patent: May 3, 2022

(54) SEMICONDUCTOR DEVICE INCLUDING DIFFERENTIAL INPUT CIRCUIT AND CALIBRATION METHOD THEREOF

(71) Applicant: SK hynix Inc., Gyeonggi-do (KR)

(72) Inventor: Yeonsu Jang, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/189,654

(22) Filed: Mar. 2, 2021

(30) Foreign Application Priority Data

Oct. 29, 2020 (KR) .................. 10-2020-0142115

(51) Int. Cl.
| | | |
|---|---|---|
| *H03K 5/00* | (2006.01) | |
| *H03K 3/013* | (2006.01) | |
| *H03K 3/0233* | (2006.01) | |
| *H03K 5/08* | (2006.01) | |
| *H03K 5/007* | (2006.01) | |
| *H03K 5/24* | (2006.01) | |

(52) U.S. Cl.
CPC .......... *H03K 3/013* (2013.01); *H03K 3/02335* (2013.01); *H03K 5/007* (2013.01); *H03K 5/08* (2013.01); *H03K 5/2481* (2013.01)

(58) Field of Classification Search
None
See application file for complete search history.

(56) References Cited

U.S. PATENT DOCUMENTS

| | | | | |
|---|---|---|---|---|
| 5,999,028 A | * | 12/1999 | Knoch | ............... H03F 3/45479 326/29 |
| 7,382,203 B2 | | 6/2008 | Kang | |
| 9,912,309 B1 | * | 3/2018 | Ecker | ..................... H03F 3/393 |
| 2004/0227554 A1 | * | 11/2004 | Park | ..................... H03L 7/0812 327/280 |
| 2007/0013440 A1 | * | 1/2007 | Chen | ................... H03F 3/45977 330/9 |
| 2008/0088350 A1 | * | 4/2008 | Sohn | ................... H03K 5/1565 327/175 |
| 2009/0273395 A1 | * | 11/2009 | Huang | ............... H03F 3/45183 330/9 |

(Continued)

OTHER PUBLICATIONS

Lee et al., Session 22 Overview: DRAM & High-Speed Interfaces, ISSCC 2020, Feb. 2020, p. 328-p. 342, IEEE.

*Primary Examiner* — Tuan T Lam
(74) *Attorney, Agent, or Firm* — IP & T Group LLP

(57) ABSTRACT

According to an embodiment, a semiconductor device includes a differential input circuit suitable for receiving first and second input signals respectively inputted to first and second input transistors, and outputting an output signal; a comparison circuit suitable for generating a first judge signal by comparing the output signal with a first comparison voltage, and generating a second judge signal by comparing the output signal with a second comparison voltage, in a calibration mode; an offset control circuit suitable for adjusting coarse codes and fine codes, according to the first and second judge signals; and an offset adjusting circuit suitable for adjusting a drivability of each of the first and second input transistors by a first strength, according to the coarse codes, and adjusting the drivability of each of the first and second input transistors by a second strength smaller than the first strength, according to the fine codes.

20 Claims, 8 Drawing Sheets

(56) References Cited

U.S. PATENT DOCUMENTS

| | | | | |
|---|---|---|---|---|
| 2010/0117735 A1* | 5/2010 | Oelmaier | ............ | H03F 3/45179 |
| | | | | 330/253 |
| 2010/0164589 A1* | 7/2010 | Lee | ................. | H03F 3/45753 |
| | | | | 327/307 |
| 2011/0128045 A1* | 6/2011 | Nakamoto | .............. | H04L 25/06 |
| | | | | 327/50 |
| 2018/0367103 A1* | 12/2018 | Kudo | .................. | H03F 3/45771 |
| 2019/0356325 A1* | 11/2019 | Hu | ..................... | H03M 1/1023 |
| 2021/0167731 A1* | 6/2021 | Agarwal | ............ | H03F 3/45197 |

\* cited by examiner

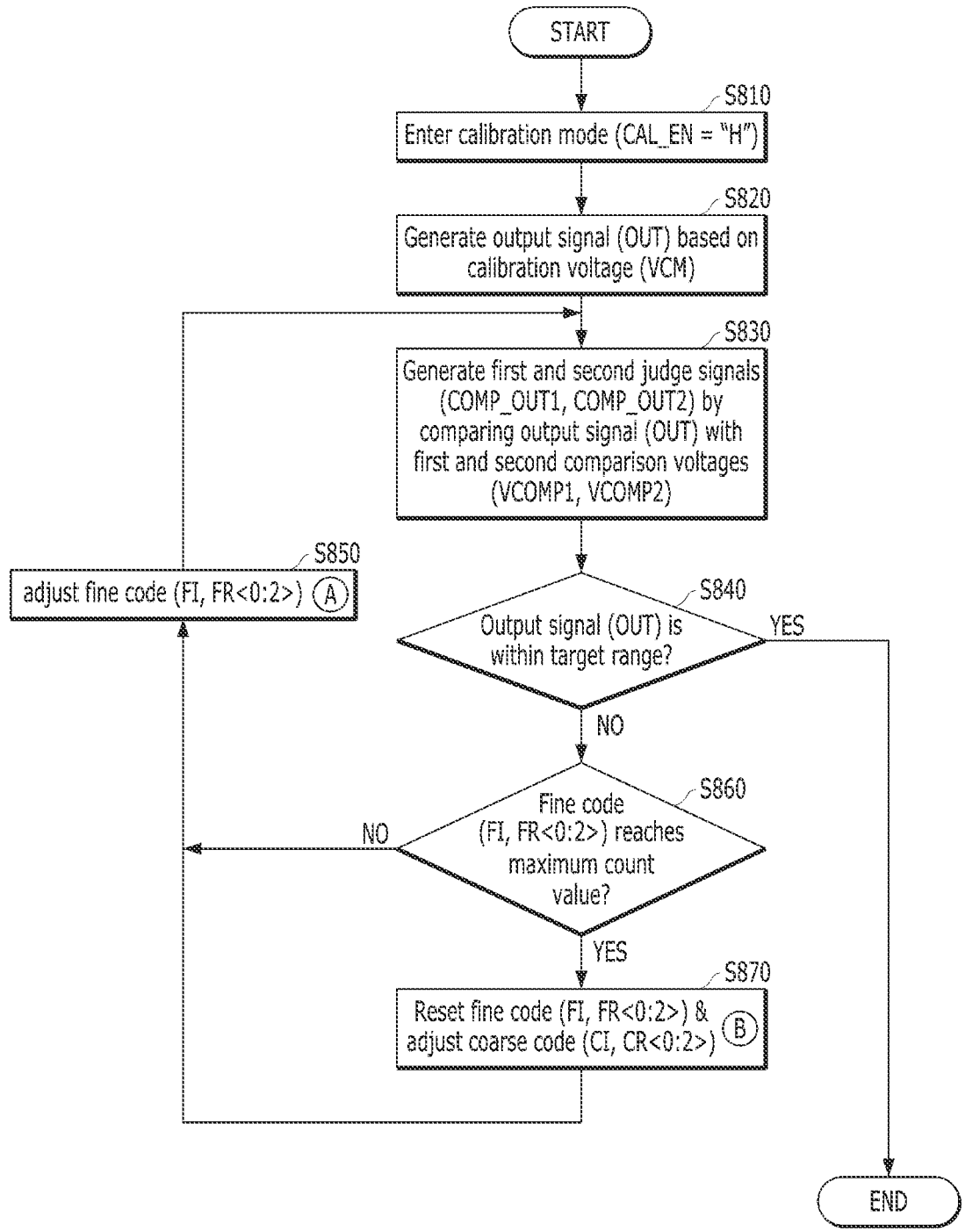

SEMICONDUCTOR DEVICE INCLUDING DIFFERENTIAL INPUT CIRCUIT AND CALIBRATION METHOD THEREOF

CROSS-REFERENCE TO RELATED APPLICATION

The present application claims priority to Korean Patent Application No. 10-2020-0142115, filed on Oct. 29, 2020, which is herein incorporated by reference in its entirety.

BACKGROUND

1. Field

The disclosure relates to semiconductor design technology, and specifically to, an offset calibration of a differential input circuit for receiving differential signals.

2. Description of the Related Art

A differential input circuit is used in almost all types of integrated circuit chips to receive and amplify differential signals from the outside.

FIG. 1 is a circuit diagram illustrating a conventional differential input circuit 10.

Referring to FIG. 1, the differential input circuit 10 receives an input signal IN and a complementary input signal INB, which are differentially provided from the outside, and compares and amplifies a voltage difference therebetween to output an output signal OUT. When a voltage level of the input signal IN is higher than a voltage level of the complementary input signal INB, the differential input circuit 10 outputs the output signal OUT at a logic high level. When the voltage level of the complementary input signal INB is higher than that of the input signal IN, the differential input circuit 10 outputs the output signal OUT at a logic low level. The differential input circuit 10 may be activated in response to an enable signal EN.

In an ideal case, the differential input circuit 10 may output the output signal OUT to a logic high level, even though the input signal IN is slightly higher than the complementary input signal INB. Furthermore, the differential input circuit 10 may output the output signal OUT to a logic low level even though the voltage level of the complementary input signal INB is slightly higher than that of the input signal IN. However, an ideal differential input circuit does not exist, and there is a certain offset value in the real differential input circuit 10 due to a mismatch of the load resistor, a mismatch of the ratio of width to length (W/L) of a pair of input transistors, a mismatch of the threshold voltage of the pair of input transistors, and so on. Thus, the real differential input circuit 10 does not perform a normal operation when a voltage difference between the input signal IN and the complementary input signal INB is not equal to or more than a certain offset value. For example, when the voltage level of the input signal IN is higher than that of the complementary input signal INB but the voltage difference is smaller than the offset value, the differential input circuit 10 may perform an abnormal operation. For example, the differential input circuit 10 may output the output signal OUT at a logic low level, i.e., an opposite operation to the normal operation.

Therefore, various schemes have been proposed to detect an offset of the differential input circuit in advance and to calibrate differential input circuit accordingly.

SUMMARY

Various embodiments of the present disclosure are directed to a semiconductor device capable of performing an accurate offset calibration operation on a differential input circuit by a coarse calibration and a fine calibration, and a calibration method of a differential input circuit thereof.

According to an embodiment of the present disclosure, a semiconductor device includes a differential input circuit suitable for receiving first and second input signals respectively inputted to first and second input transistors, and outputting an output signal; a comparison circuit suitable for generating a first judge signal by comparing the output signal with a first comparison voltage, and generating a second judge signal by comparing the output signal with a second comparison voltage, in a calibration mode; an offset control circuit suitable for adjusting coarse codes and fine codes, according to the first and second judge signals; and an offset adjusting circuit suitable for adjusting a drivability of each of the first and second input transistors by a first strength, according to the coarse codes, and adjusting the drivability of each of the first and second input transistors by a second strength smaller than the first strength, according to the fine codes.

According to an embodiment of the present disclosure, a calibration method of a differential input circuit for outputting an output signal by receiving first and second input signals respectively inputted to first and second input transistors, includes entering a calibration mode; generating a first judge signal by comparing the output signal with a first comparison voltage, and generating a second judge signal by comparing the output signal with a second comparison voltage; performing iterations each comprising: performing iterations of adjusting fine codes according to the first and second judge signals and adjusting a drivability of each of the first and second input transistors by a second strength according to the adjusted fine codes; and adjusting, when any of the adjusted fine codes reaches a maximum count value, coarse codes according to the first and second judge signals and adjusting the drivability of each of the first and second input transistors by a first strength greater than the second strength according to the adjusted coarse codes.

According to an embodiment of the present disclosure, a calibrator for calibrating a circuit configured to amplify differential inputs respectively through first and second transistors to generate an output, includes a voltage circuitry suitable for generating a target voltage range and a reference voltage provided as each of the differential inputs; and a control circuitry suitable for adjusting, when the output is beyond the target voltage range, each drivability of the first and second transistors to cause the circuit to change the output, wherein the control circuitry adjusts the drivability through iterations each comprising iterations of fine adjustments and a coarse adjustment to be performed when the fine adjustment of a current iteration reaches a fine adjustment limit.

According to an embodiment of the present disclosure, a method of calibrating a circuit configured to amplify differential inputs respectively through first and second transistors to generate an output, includes providing a reference voltage provided as each of the differential inputs; and adjusting, when the output is beyond a target voltage range, each drivability of the first and second transistors to cause the circuit to change the output, wherein the adjusting includes performing iterations each comprising iterations of fine adjustments and a coarse adjustment to be performed when the fine adjustment of a current iteration reaches a fine adjustment limit.

According to the embodiments of the present disclosure, the differential input circuit may compensate for an offset due to a mismatch of input transistors through stepwise calibration operations, thereby preventing deterioration of the characteristics of the differential input circuit and enabling a normal operation.

BRIEF DESCRIPTION OF THE DRAWINGS

FIGS. 8 to 10 are flow charts for describing a calibration operation of a differential input circuit of a semiconductor device in accordance with an embodiment of the present invention.

DETAILED DESCRIPTION

Figure 1:
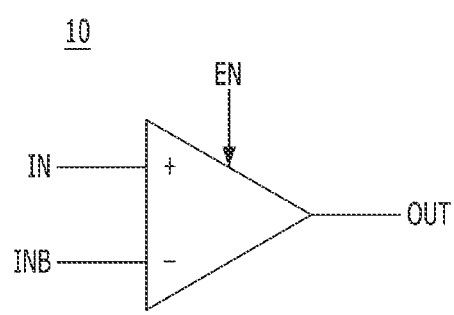
FIG. 1 is a circuit diagram illustrating a conventional differential input circuit.

Various embodiments of the present disclosure are described below with reference to the accompanying drawings. The embodiments may, however, be embodied in different forms and thus should not be construed as limited to the embodiments set forth herein. Throughout the disclosure, like reference numerals refer to like parts throughout the various figures and embodiments of the present invention. It is noted that reference to "an embodiment," "another embodiment" or the like does not necessarily mean only one embodiment, and different references to any such phrase are not necessarily to the same embodiment(s). The term "embodiments" when used herein does not necessarily refer to all embodiments.

It will be understood that, although the terms "first", "second", "third", and so on may be used herein to identify various elements, these elements are not limited by these terms. These terms are used to distinguish one element from another element that otherwise have the same or similar names. Thus, a first element in one instance could also be termed a second or third element in another instance without indicating any change in the element itself.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present. Communication between two elements, whether directly or indirectly connected/coupled, may be wired or wireless, unless stated or the context indicates otherwise.

As used herein, singular forms may include the plural forms as well and vice versa, unless the context clearly indicates otherwise.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Figure 2:
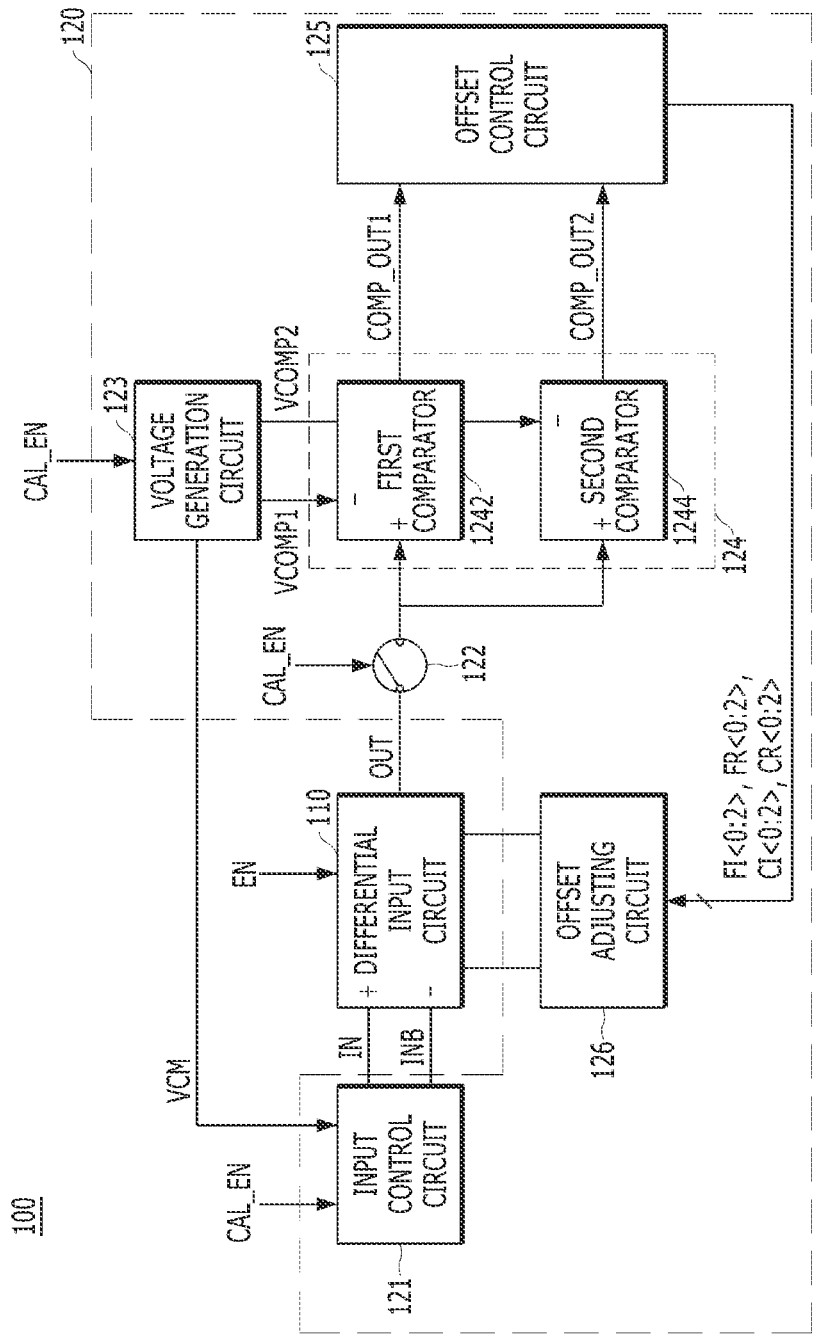
FIG. 2 is a block diagram illustrating a semiconductor device including a differential input circuit and a calibration circuit in accordance with an embodiment of the present invention.

FIG. 2 is a block diagram illustrating a semiconductor device 100 including a differential input circuit 110 and a calibration circuit 120 in accordance with an embodiment of the present invention.

Referring to FIG. 2, the differential input circuit 110 may be activated in response to an enable signal EN and receive a first input signal IN through a positive input terminal (+) and a second input signal INB through a negative input terminal (−). The differential input circuit 110 may compare the first input signal IN with the second input signal INB to output an output signal OUT. The differential input circuit 110 may include a first input transistor (M1 of FIG. 4) having a gate for receiving the first input signal IN through the positive input terminal (+), and a second input transistor (M2 of FIG. 4) having a gate for receiving the second input signal INB through the negative input terminal (−).

The calibration circuit 120 may cancel an offset of the differential input circuit 110 by adjusting the drivability of each of the first and second input transistors M1 and M2 in two stages in a calibration mode.

In an embodiment, the calibration circuit 120 may include an input control circuit 121, an output control circuit 122, a voltage generation circuit 123, a comparison circuit 124, an offset control circuit 125, and an offset adjusting circuit 126.

The input control circuit 121 may provide a calibration voltage VCM as both the first input signal IN and the second input signal INB of the differential input circuit 110, in response to a calibration enable signal CAL_EN that is enabled in the calibration mode. A detailed configuration and operation of the input control circuit 121 will be described in FIG. 3.

The output control circuit 122 may provide the output signal OUT outputted from the differential input circuit 110 to the comparison circuit 124, in response to the calibration enable signal CAL_EN.

The voltage generation circuit 123 may generate the calibration voltage VCM, first and second comparison voltages VCOMP1 and VCOMP2, in response to the calibration enable signal CAL_EN. The first and second comparison voltages VCOMP1 and VCOMP2 may have different voltage levels from each other. In an embodiment, the first comparison voltage VCOMP1 may have a voltage level higher than that of the second comparison voltage VCOMP2. The calibration voltage VCM may have a preset voltage level between a ground voltage and a source voltage.

The comparison circuit 124 may generate first and second judge signals COMP_OUT1 and COMP_OUT2 by comparing the output signal OUT provided from the output control circuit 122, with the first and second comparison voltages VCOMP1 and VCOMP2, respectively, in the calibration mode. The comparison circuit 124 may include a first comparator 1242 and a second comparator 1244. The first comparator 1242 may output the first judge signal COMP_OUT1 by comparing the output signal OUT with the first comparison voltage VCOMP1. The first comparator 1242 may output the first judge signal COMP_OUT1 of a logic high level when a voltage level of the output signal OUT is higher than or equal to a voltage level of the first comparison voltage VCOMP1. The second comparator 1244 may output the second judge signal COMP_OUT2 by comparing the output signal OUT with the voltage level of the second comparison voltage VCOMP2. The second comparator 1244 may output the second judge signal COMP_OUT2 of a logic high level when a voltage level of the output signal OUT is higher than or equal to a voltage level of the second comparison voltage VCOMP2.

The offset control circuit 125 may generate and adjust coarse codes CI<0:2> and CR<0:2> and fine codes FI<0:2> and FR<0:2>, according to the first and second judge signals COMP_OUT1 and COMP_OUT2. In accordance with an embodiment of the present invention, since the first comparison voltage VCOMP1 has a voltage level higher than that of the second comparison voltage VCOMP2, the first judge signal COMP_OUT1 may not have a logic high level and the second judge signal COMP_OUT2 may not have a logic low level. The offset control circuit 125 may not adjust but maintains the coarse codes CI<0:2> and CR<0:2> and the fine codes FI<0:2> and FR<0:2>, when the first judge signal COMP_OUT1 has a logic low level, which is different from the second judge signal COMP_OUT2 of a logic high level.

That is, the offset control circuit 125 may maintain the pre-stored coarse codes CI<0:2> and CR<0:2> and fine codes FI<0:2> and FR<0:2>, when the voltage level of the output signal OUT exists in any direct current (DC) level set by a design, between the first judge signal COMP_OUT1 and the second judge signal COMP_OUT2 (hereinafter, referred to as a "target range"). The offset control circuit 125 may increase or decrease the coarse codes CI<0:2> and CR<0:2> and the fine codes FI<0:2> and FR<0:2>, when both of the first judge signal COMP_OUT1 and the second judge signal COMP_OUT2 have logic high levels, or both of the first judge signal COMP_OUT1 and the second judge signal COMP_OUT2 have logic low levels. For example, when both of the first judge signal COMP_OUT1 and the second judge signal COMP_OUT2 have the logic high levels, the offset control circuit 125 may adjust the coarse codes CI<0:2> and CR<0:2> and the fine codes FI<0:2> and FR<0:2> to increase the drivability of the first input transistor M1 while decreasing the drivability of the second input transistor M2, thereby lowering the voltage level of the output signal OUT. When both of the first judge signal COMP_OUT1 and the second judge signal COMP_OUT2 have the logic low levels, the offset control circuit 125 may adjust the coarse codes CI<0:2> and CR<0:2> and the fine codes FI<0:2> and FR<0:2> to decrease the drivability of the first input transistor M1 while increasing the drivability of the second input transistor M2, thereby increasing the voltage level of the output signal OUT.

The offset control circuit 125 may first adjust the fine codes FI<0:2> and FR<0:2>, prior to the coarse codes CI<0:2> and CR<0:2>, according to the first judge signal COMP_OUT1 and the second judge signal COMP_OUT2. When the fine codes FI<0:2> and FR<0:2> are fully counted, i.e., any of the fine codes FI<0:2> and FR<0:2> reaches a maximum count value, as all-zero or all-high values, the offset control circuit 125 may determine whether to adjust the coarse codes CI<0:2> and CR<0:2> according to the first and second judge signals COMP_OUT1 and COMP_OUT2, which are generated by the comparison circuit 124 based on the adjusted fine codes FI<0:2> and FR<0:2>. The offset control circuit 125 may sequentially output the coarse codes CI<0:2> and CR<0:2> and the fine codes FI<0:2> and FR<0:2>, according to the determination result. A detailed configuration and operation of the offset control circuit 125 will be described in FIGS. 6 to 7B.

For reference, the coarse codes CI<0:2> and CR<0:2> may include a first coarse code CI<0:2> and a second coarse code CR<0:2>, and the fine codes FI<0:2> and FR<0:2> may include a first fine code FI<0:2> and a second fine code FR<0:2>. The first coarse code CI<0:2> and the first fine code FI<0:2> may adjust the drivability of the first input transistor M1, and the second code CR<0:2> and the second fine code FR<0:2> may adjust the drivability of the second input transistor M2.

The offset adjusting circuit 126 may adjust the drivability of each of the first and second input transistors M1 and M2 by a first strength, according to the coarse codes CI<0:2> and CR<0:2>. The offset adjusting circuit 126 may adjust the drivability of each of the first and second input transistors M1 and M2 by a second strength smaller than the first strength, according to the fine codes FI<0:2> and FR<0:2>. The offset adjusting circuit 126 may adjust the drivability of the first input transistor M1 by the first strength according to the first coarse code CI<0:2> and by the second strength according to the first fine code FI<0:2>. Likewise, the offset adjusting circuit 126 may adjust the drivability of the second input transistor M2 by the first strength according to the second coarse code CR<0:2> and by the second strength according to the second fine code FR<0:2>. A detailed configuration and operation of the offset adjusting circuit 126 will be described in FIGS. 4 and 5.

Figure 3:
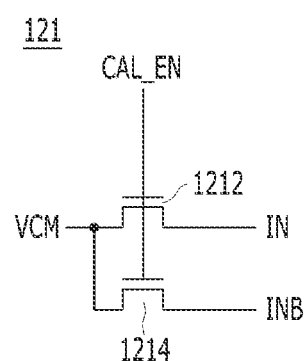
FIG. 3 is a circuit diagram illustrating an input control circuit of FIG. 2.

FIG. 3 is a circuit diagram illustrating the input control circuit 121 of FIG. 2.

Referring to FIG. 3, the input control circuit 121 may include a first path selector 1212 and a second path selector 1214. The first path selector 1212 may be turned on according to the calibration enable signal CAL_EN, and provide the calibration voltage VCM as the first input signal IN. The second path selector 1214 may be turned on according to the calibration enable signal CAL_EN, and provide the calibration voltage VCM as the second input signal INB. The first and second path selectors 1212 and 1214 may be implemented with an NMOS transistor.

As described, the input control circuit 121 may provide the calibration voltage VCM as both the first input signal IN and the second input signal INB in the calibration mode.

Figure 4:
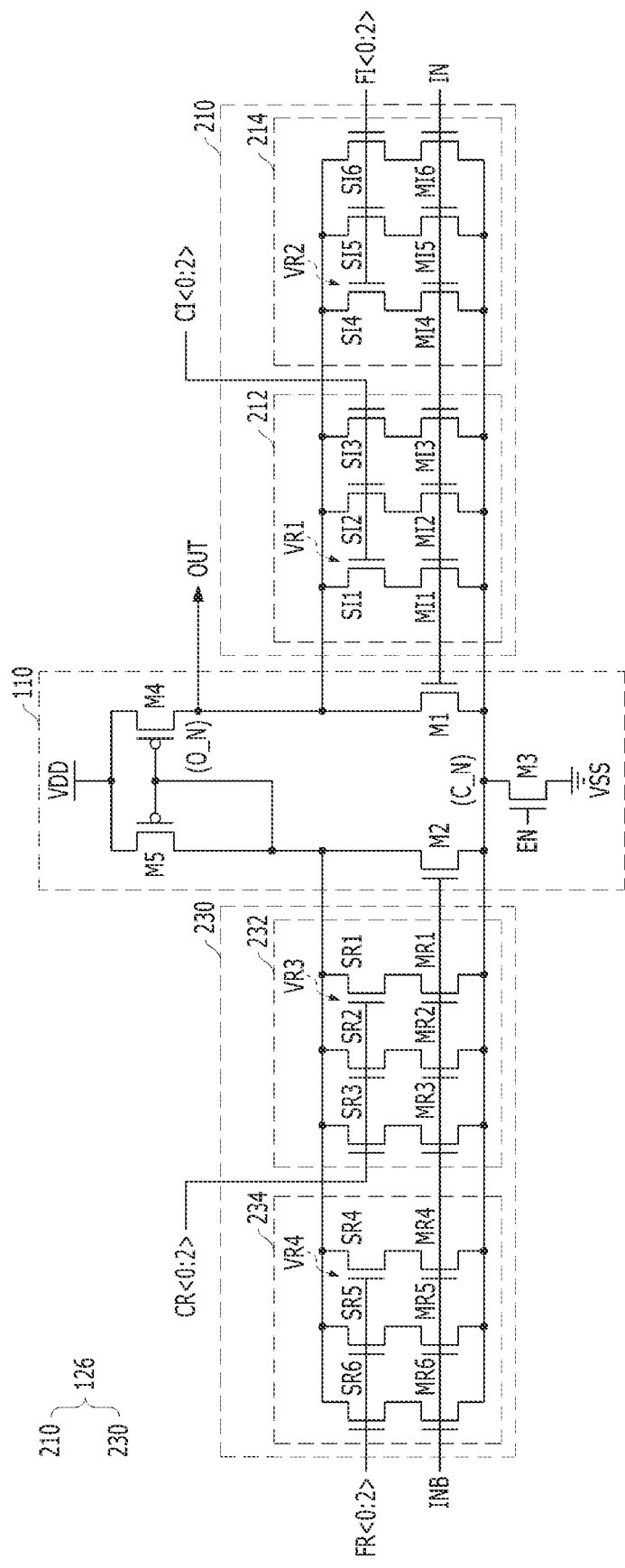
FIG. 4 is a circuit diagram illustrating the differential input circuit and an offset adjusting circuit of FIG. 2.

FIG. 4 is a circuit diagram illustrating the differential input circuit 110 and the offset adjusting circuit 126 of FIG. 2.

Referring to FIG. 4, the differential input circuit 110 may include the first input transistor M1, the second input transistor M2, a biasing transistor M3, a first mirror transistor M4, and a second mirror transistor M5. For example, the first input transistor M1, the second input transistor M2, and the biasing transistor M3 may be implemented with an NMOS transistor, the first mirror transistor M4 and the second mirror transistor M5 may be implemented with a PMOS transistor.

The biasing transistor M3 may be coupled between a common node C_N and a ground voltage (VSS) terminal and have a gate for receiving the enable signal EN. When the enable signal EN is enabled to a logic high level, the biasing transistor M3 may be turned on to provide a sink path to supply a bias to the differential input circuit 110.

The first input transistor M1 may be coupled between the first mirror transistor M4 and the common node C_N, and have a gate for receiving the first input signal IN. The second input transistor M2 may be coupled between the second mirror transistor M5 and the common node C_N and have a gate for receiving the second input signal INB. The first mirror transistor M4 may be coupled between a source voltage (VDD) terminal and the first input transistor M1, and the second mirror transistor M5 may be coupled between the source voltage (VDD) terminal and the second input transistor M2. The first and second mirror transistors M4 and M5 may have gates coupled to a drain of the second mirror transistor M5 in common, to thereby form a current mirror. Accordingly, the current flowing to the second input transistor M2 from the second mirror transistor M5 may be mirrored to the first input transistor M1. Finally, the output signal OUT may be outputted through an output node O_N between the first mirror transistor M4 and the first input transistor M1.

As described, in the differential input circuit 110, when the first input signal IN has a voltage level higher than that of the second input signal INB, the first input transistor M1 may be turned on, allowing the more current to flow to the common node C_N through the drain and source of the first input transistor M1. As a result, since a voltage level of the output node O_N becomes lowered, the output signal OUT may be outputted as a logic low level. On the contrary, when the first input signal IN has a voltage level lower than that of the second input signal INB, the second input transistor M2 may be turned on, allowing the more current to flow to the common node C_N through the drain and source of the second input transistor M2. As a result, since the voltage level of the output node O_N becomes increased, the output signal OUT may be outputted as a logic high level.

The offset adjusting circuit 126 may include a first offset adjuster 210 for adjusting the drivability of the first input transistor M1, and a second offset adjuster 230 for adjusting the drivability of the second input transistor M2. The first offset adjuster 210 may include a first coarse adjuster 212 and a first fine adjuster 214. The first coarse adjuster 212 may adjust the drivability of the first input transistor M1 by the first strength according to the first coarse code CI<0:2>. The first fine adjuster 214 may adjust the drivability of the first input transistor M1 by the second strength according to the first fine code FI<0:2>. The second offset adjuster 230 may include a second coarse adjuster 232 and a second fine adjuster 234. The second coarse adjuster 232 may adjust the drivability of the second input transistor M2 by the first strength according to the second coarse code CR<0:2>. The second fine adjuster 234 may adjust the drivability of the second input transistor M2 by the second strength according to the second fine code FR<0:2>.

In an embodiment, the first coarse adjuster 212 may include a plurality of first variable resistors VR1 coupled in parallel between the drain and the source of the first input transistor M1. The plurality of first variable resistors VR1 may have different resistance values from each other, and the number of the first variable resistors VR1 may correspond to the bit number (e.g., 3) of the first coarse code CI<0:2>. Each of the first variable resistors VR1 may include a switch SI1 to SI3 and an adjusting transistor MI1 to MI3, which are coupled in series. The first fine adjuster 214 may include a plurality of second variable resistors VR2 coupled in parallel between the drain and the source of the first input transistor M1. The plurality of second variable resistors VR2 may have different resistance values from each other, and the number of the second variable resistors VR2 may correspond to the bit number (e.g., 3) of the first fine code FI<0:2>. Each of the second variable resistors VR2 may include a switch SI4 to SI6 and an adjusting transistor MI4 to MI6, which are coupled in series.

The second coarse adjuster 232 may include a plurality of third variable resistors VR3 coupled in parallel between the drain and the source of the second input transistor M2. The plurality of third variable resistors VR3 may have different resistance values from each other, and the number of the third variable resistors VR3 may correspond to the bit number (e.g., 3) of the second coarse code CR<0:2>. Each of the third variable resistors VR3 may include a switch SR1 to SR3 and an adjusting transistor MR1 to MR3, which are coupled in series. The second fine adjuster 234 may include a plurality of fourth variable resistors VR4 coupled in parallel between the drain and the source of the second input transistor M2. The plurality of fourth variable resistors VR4 may have different resistance values from each other, and the number of the fourth variable resistors VR4 may correspond to the bit number (e.g., 3) of the second fine code FR<0:2>. Each of the fourth variable resistors VR4 may include a switch SR4 to SR6 and an adjusting transistor MR4 to MR6, which are coupled in series.

Since the second offset adjuster 230 has substantially the same configuration as the first offset adjuster 210, the first offset adjuster 210 will be described as an example. In the example, each of the first and second coarse codes CI<0:2> and CR<0:2> and the first and second fine codes FI<0:2> and FR<0:2> is composed of 3 bits.

Figure 5:
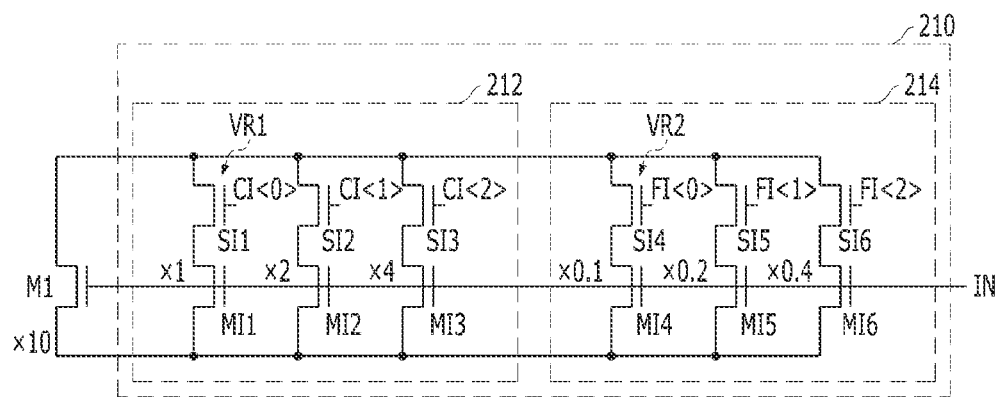
FIG. 5 is a circuit diagram illustrating a first offset adjuster of FIG. 4.

FIG. 5 is a circuit diagram illustrating the first offset adjuster 210 of FIG. 4.

Referring to FIG. 5, the first variable resistors VR1 in the first coarse adjuster 212 may include first to third switches SI1 to SI3, and first to third adjusting transistors MI1 to MI3. The first to third switches SI1 to SI3 may be implemented with a transistor and turned on in response to the respective bits of the first coarse code CI<0:2>. The first to third adjusting transistors MI1 to MI3 may have gates for receiving the first input signal IN in common. In an embodiment, the first to third switches SI1 to SI3, and the first to third adjusting transistors MI1 to MI3 may be implemented with an NMOS transistor. Each of the first variable resistors VR1 may be composed of a corresponding one of the first to third switches SI1 to SI3 and a corresponding one of the first to third adjusting transistors MI1 to MI3, in series between the drain and the source of the first input transistor M1. For example, when a first bit CI<0> of the first coarse code CI<0:2> becomes a high bit, the first switch SI1 is turned on so that the first variable resistor VR1 may provide the variable resistance value corresponding to a resistance of the first adjusting transistor MI1.

The second variable resistors VR2 in the first fine adjuster 214 may include fourth to sixth switches SI4 to SI6, and fourth to sixth adjusting transistors MI4 to MI6. The fourth to sixth switches SI4 to SI6 may be implemented with a transistor and turned on in response to the respective bits of the first fine code FI<0:2>. The fourth to sixth adjusting transistors MI4 to MI6 may have gates for receiving the first input signal IN in common. In an embodiment, the fourth to sixth switches SI4 to SI6, and the fourth to sixth adjusting transistors MI4 to MI6 may be implemented with an NMOS transistor. Each of the second variable resistors VR2 may be composed of a corresponding one of the fourth to sixth switches SI4 to SI6, and a corresponding one of the fourth to sixth adjusting transistors MI4 to MI6, in series between the drain and the source of the first input transistor M1. For example, when a first bit FI<0> of the first fine code FI<0:2> becomes a high bit, the fourth switch SI4 is turned on so that the second variable resistor VR2 may provide the variable resistance value corresponding to a resistance of the fourth adjusting transistor MI4.

In accordance with the embodiment, the first to sixth adjusting transistors MI1 to MI6 may have different size (i.e., a ratio of width to length, W/L) from each other. For example, the first to third adjusting transistors MI1 to MI3 sequentially receive the first to third bits of the first coarse code CI<0:2>, and each of the first and second input transistors M1 and M2 is set to have x10 size (W/L). In an embodiment, the first to third adjusting transistors MI1 to MI3 may have x1, x2, and x4 sizes (W/L), which are sequentially increasing, compared to the first and second input transistors M1 and M2 of x10 size (W/L). Accordingly, when at least one bit of the first coarse code CI<0:2> becomes a high bit, the first coarse adjuster 212 may provide the variable resistance value corresponding to the resistance of the adjusting transistor coupled to the switch turned on according to the high bit.

Furthermore, for example, the fourth to sixth adjusting transistors MI4 to MI6 sequentially receive the first to third bits of the first fine code FI<0:2>, and each of the first and second input transistors M1 and M2 is set to have x10 size (W/L). At this time, the fourth to sixth adjusting transistors MI4 to MI6 may have x0.1, x0.2, and x0.4 sizes (W/L), which are sequentially increasing, compared to the first and second input transistors M1 and M2 of x10 size (W/L).

Accordingly, when at least one bit of the first fine code FI<0:2> becomes a high bit, the first fine adjuster 214 may provide the variable resistance value corresponding to the resistance of the adjusting transistor coupled to the switch turned on according to the high bit.

As described above, the first to third adjusting transistors MI1 to MI3 may have a size greater than that of the fourth to sixth adjusting transistors MI4 to MI6. Thus, the first coarse adjuster 212 may coarsely adjust the drivability of the first input transistor M1 by the first strength, while the first fine adjuster 214 may finely adjust the drivability of the first input transistor M1 by the second strength smaller than the first strength.

Figure 6:
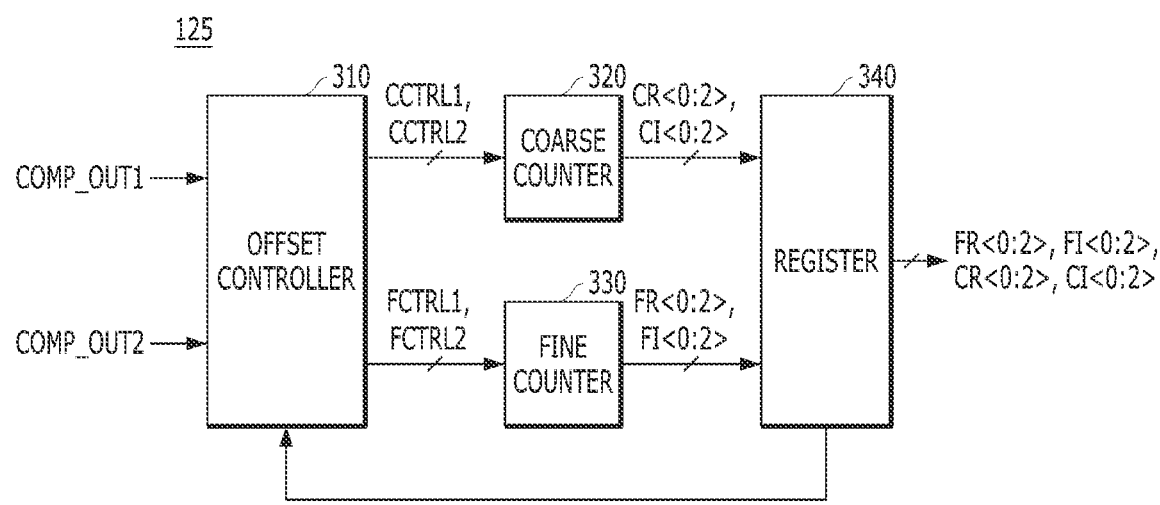
FIG. 6 is a circuit diagram illustrating an offset control circuit of FIG. 2.

FIG. 6 is a circuit diagram illustrating the offset control circuit 125 of FIG. 2.

Referring to FIG. 6, the offset control circuit 125 may include an offset controller 310, a coarse counter 320, a fine counter 330, and a register 340.

The offset controller 310 may generate counting control signals CCTRL1, CCTRL2, FCTRL1, and FCTRL2 to increase or decrease the coarse codes CI<0:2> and CR<0:2> and the fine codes FI<0:2> and FR<0:2>, based on the first and second judge signals COMP_OUT1 and COMP_OUT2. The counting control signals CCTRL1, CCTRL2, FCTRL1, and FCTRL2 may include a first coarse control signal CCTRL1 to increase or decrease the first coarse code CI<0:2>, a second coarse control signal CCTRL2 to increase or decrease the second coarse code CR<0:2>, a first fine control signal FCTRL1 to increase or decrease the first fine code FI<0:2>, and a second fine control signal FCTRL2 to increase or decrease the second fine code FR<0:2>. The offset controller 310 may generate the counting control signals CCTRL1, CCTRL2, FCTRL1, and FCTRL2 based on the first and second judge signals COMP_OUT1 and COMP_OUT2, after reading out the coarse codes CI<0:2> and CR<0:2> and the fine codes FI<0:2> and FR<0:2>, which are pre-stored in the register 340.

In an embodiment, the offset controller 310 may generate the first and second fine control signals FCTRL1 and FCTRL2, prior to the first and second coarse control signals CCTRL1 and CCTRL2, based on the first and second judge signals COMP_OUT1 and COMP_OUT2. Thereafter, when any of the fine codes FI<0:2> and FR<0:2>, which are adjusted by the first and second fine control signals FCTRL1 and FCTRL2, reaches the maximum count value, the offset controller 310 may determine whether to generate the first and second coarse control signals CCTRL1 and CCTRL2. The offset controller 310 may sequentially output the first and second coarse control signals CCTRL1 and CCTRL2, and the first and second fine control signals FCTRL1 and FCTRL2, according to the determination result.

The coarse counter 320 may increase or decrease the first coarse code CI<0:2> and the second coarse code CR<0:2>, according to the first and second coarse control signals CCTRL1 and CCTRL2.

The fine counter 330 may increase or decrease the first fine code FI<0:2> and the second fine code FR<0:2>, according to the first and second fine control signals FCTRL1 and FCTRL2.

The register 340 may store the first coarse code CI<0:2>, the second coarse code CR<0:2>, the first fine code FI<0:2>, the second fine code FR<0:2>, outputted from the coarse counter 320 and the fine counter 330.

Figure 7A:
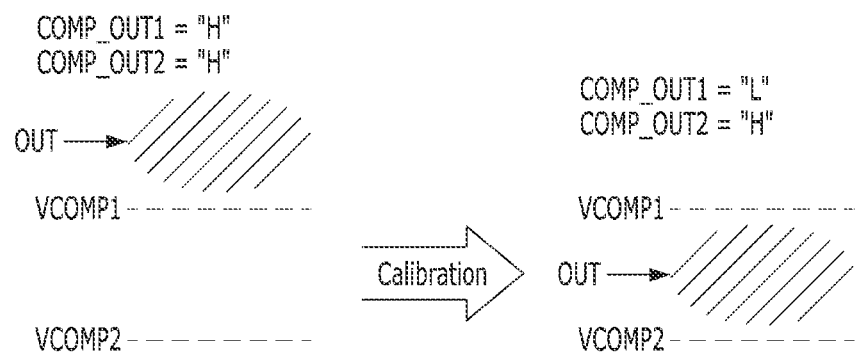
FIGS. 7A and 7B are timing diagrams for describing an operation of an offset controller of FIG. 6.
Figure 7B:
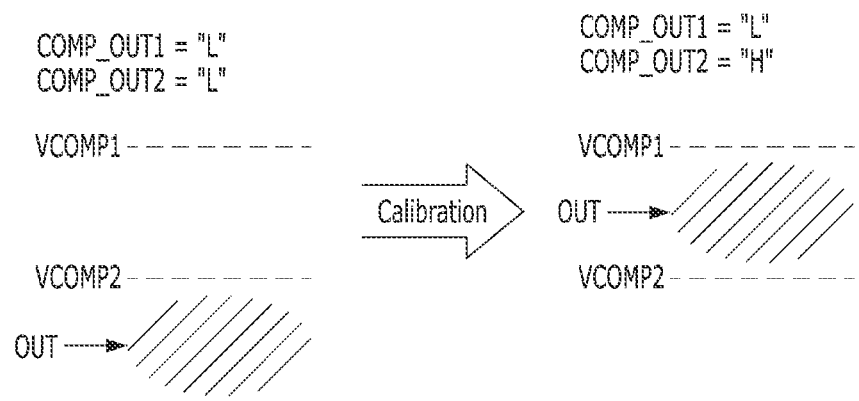

FIGS. 7A and 7B are timing diagrams for describing an operation of the offset controller 310 of FIG. 6, according to the first and second judge signals COMP_OUT1 and COMP_OUT2.

Referring to FIG. 7A, the first and second judge signals COMP_OUT1 and COMP_OUT2 become a logic high level when the output signal OUT has a voltage level higher than or equal to that of the first comparison voltage VCOMP1. At this time, the offset controller 310 may control to increase the voltage level of the first input signal IN while decreasing the voltage level of the second input signal INB, thereby lowering the voltage level of the output signal OUT. That is, the offset controller 310 may generate the counting control signals CCTRL1 and FCTRL1 to increase the drivability of the first input transistor M1. For example, the offset controller 310 generates the first fine control signal FCTRL1 to increase the first fine code FI<0:2> from "000" to "111" or generates the first coarse control signal CCTRL1 to increase the first coarse code CI<0:2> from "000" to "111".

Furthermore, the offset controller 310 may generate the counting control signals CCTRL2 and FCTRL2 to decrease the drivability of the second input transistor M2. For example, the offset controller 310 generates the second fine control signal FCTRL2 to decrease the second fine code FR<0:2> from "111" to "000" or generates the second coarse control signal CCTRL2 to decrease the second coarse code CR<0:2> from "000" to "111".

Referring to FIG. 7B, the first and second judge signals COMP_OUT1 and COMP_OUT2 become a logic low level when the output signal OUT has a voltage level lower than that of the second comparison voltage VCOMP2. At this time, the offset controller 310 may control to decrease the voltage level of the first input signal IN while increasing the voltage level of the second input signal INB, thereby increasing the voltage level of the output signal OUT. That is, the offset controller 310 may generate the counting control signals CCTRL1 and FCTRL1 to decrease the drivability of the first input transistor M1. For example, the offset controller 310 generates the first fine control signal FCTRL1 to decrease the first fine code FI<0:2> or generates the first coarse control signal CCTRL1 to decrease the first coarse code CI<0:2>. Furthermore, the offset controller 310 may generate the counting control signals CCTRL2 and FCTRL2 to increase the drivability of the second input transistor M2. For example, the offset controller 310 generates the second fine control signal FCTRL2 to increase the second fine code FR<0:2> or generates the second coarse control signal CCTRL2 to increase the second coarse code CR<0:2>.

When the output signal OUT has a voltage level within the target range, the offset controller 310 may not generate or adjust the counting control signals CCTRL1, CCTRL2, FCTRL1, and FCTRL2. As a result, by maintaining the first coarse code CI<0:2>, the second coarse code CR<0:2>, the first fine code FI<0:2>, and the second fine code FR<0:2>, which are pre-stored in the register 340, the drivability of the first and second input transistors M1 and M2 may not be adjusted.

Hereinafter, referring to FIGS. 2 to 10, a calibration method of a differential input circuit in accordance with an embodiment of the present invention will be described.

Figure 9:
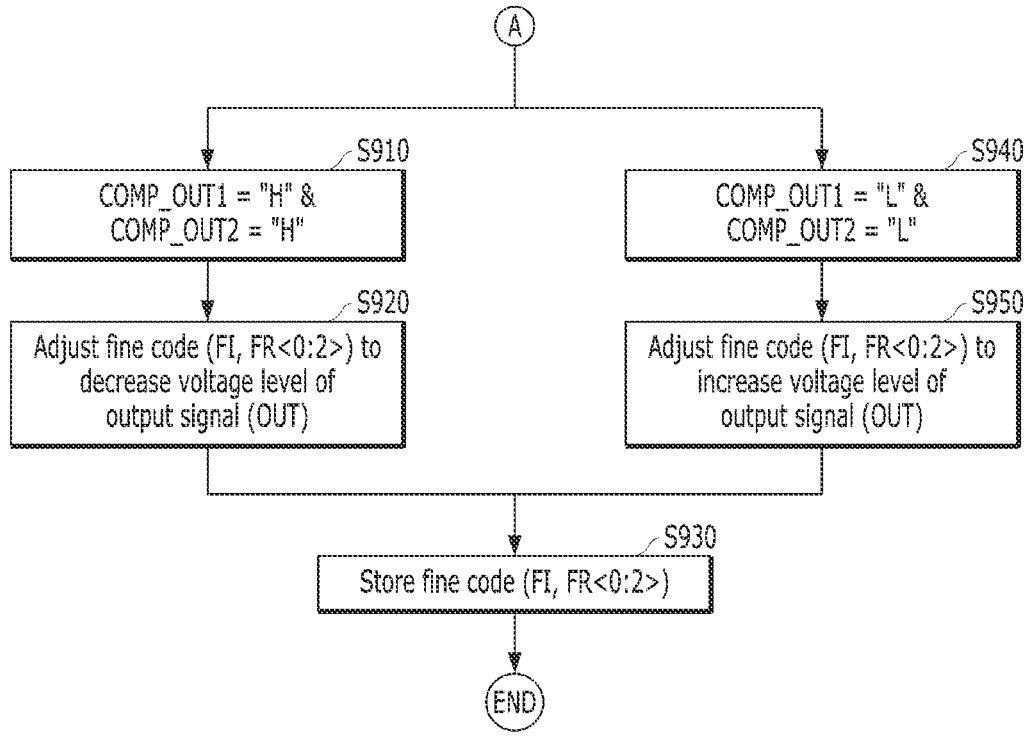
Figure 10:
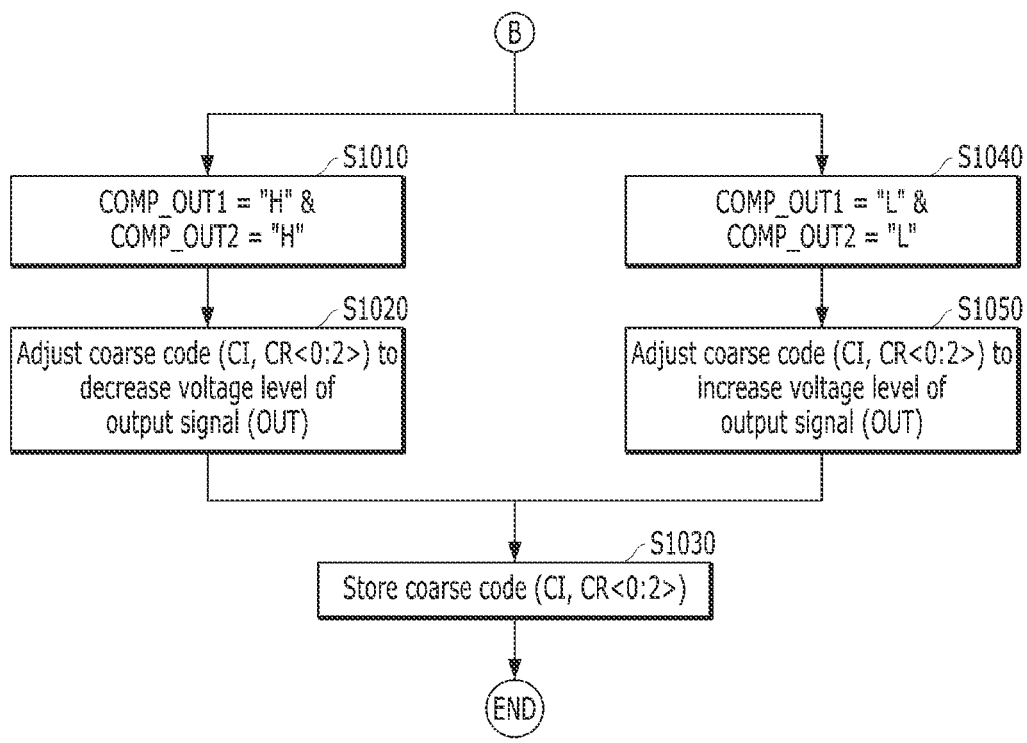

FIGS. 8 to 10 are flow charts for describing a calibration operation of a differential input circuit of a semiconductor device in accordance with an embodiment of the present invention.

Referring to FIG. 8, the calibration enable signal CAL_EN is enabled when entering the calibration mode (at S810). The enable signal EN is also enabled in the calibration mode.

The input control circuit 121 provides the calibration voltage VCM as both the first input signal IN and the second input signal INB of the differential input circuit 110. The differential input circuit 110 receives and compares the first input signal IN with the second input signal INB, to output the output signal OUT (at S820). The output control circuit 122 provides the output signal OUT outputted from the differential input circuit 110 to the comparison circuit 124. In an ideal case where there is no offset in the differential input circuit 110, when the first input signal IN is inputted to have substantially the same voltage level as the second input signal INB, the output signal OUT may be outputted to have a voltage level within the target range. However, since there is a certain offset value in the real differential input circuit 110 due to a mismatch between the first and second input transistors M1 and M2, the voltage level of the output signal OUT may vary depending on the offset.

The first comparator 1242 outputs the first judge signal COMP_OUT1 by comparing the output signal OUT with the first comparison voltage VCOMP1. The second comparator 1244 outputs the second judge signal COMP_OUT2 by comparing the output signal OUT with the voltage level of the second comparison voltage VCOMP2 (at S830).

The offset control circuit 125 first generates and adjusts the fine codes FI<0:2> and FR<0:2>, prior to the coarse codes CI<0:2> and CR<0:2>, according to the first and second judge signals COMP_OUT1 and COMP_OUT2. When the output signal OUT has a voltage level within the target range ("YES" at S840), the first judge signal COMP_OUT1 becomes a logic low level and the second judge signal COMP_OUT2 becomes a logic high level. At this time, the offset control circuit 125 may terminate the calibration operation without adjusting the coarse codes CI<0:2> and CR<0:2> and the fine codes FI<0:2> and FR<0:2>. In detail, the offset controller 310 may not generate the counting control signals CCTRL1, CCTRL2, FCTRL1, and FCTRL2 so as not to adjust the coarse codes CI<0:2> and CR<0:2> and the fine codes FI<0:2> and FR<0:2>. As a result, by maintaining the coarse codes CI<0:2> and CR<0:2> and the fine codes FI<0:2> and FR<0:2>, which are pre-stored in the register 340, the drivability of the first and second input transistors M1 and M2 may not be adjusted.

When the output signal OUT has a voltage level out of the target range ("NO" at S840), the offset control circuit 125 may adjust the fine codes FI<0:2> and FR<0:2>, according to the first and second judge signals COMP_OUT1 and COMP_OUT2 (at S850).

Referring to FIG. 9, when both of the first judge signal COMP_OUT1 and the second judge signal COMP_OUT2 have logic high levels (at S910), the offset control circuit 125 may adjust the fine codes FI<0:2> and FR<0:2> to increase the drivability of the first input transistor M1 while decreasing the drivability of the second input transistor M2, thereby lowering the voltage level of the output signal OUT (at S920). In detail, the offset controller 310 generates the first fine control signal FCTRL1 to increase the first fine code FI<0:2> and generates the second fine control signal FCTRL2 to decrease the second fine code FR<0:2>. The fine counter 330 increases the first fine code FI<0:2> while decreasing the second fine code FR<0:2>, according to the first and second fine control signals FCTRL1 and FCTRL2. The register 340 stores the first fine code FI<0:2> and the second fine code FR<0:2> (at S930).

When both of the first judge signal COMP_OUT1 and the second judge signal COMP_OUT2 have logic low levels (at S940), the offset control circuit 125 may adjust the fine codes FI<0:2> and FR<0:2> to decrease the drivability of the first input transistor M1 while increasing the drivability of the second input transistor M2, thereby increasing the voltage level of the output signal OUT (at S950). In detail, the offset controller 310 generates the first fine control signal FCTRL1 to decrease the first fine code FI<0:2> and generates the second fine control signal FCTRL2 to increase the second fine code FR<0:2>. The fine counter 330 decreases the first fine code FI<0:2> while increasing the second fine code FR<0:2>, according to the first and second fine control signals FCTRL1 and FCTRL2. The register 340 stores the first fine code FI<0:2> and the second fine code FR<0:2> (at S930).

Referring back to FIG. 8, the first and second judge signals COMP_OUT1 and COMP_OUT2 are generated by the comparison circuit 124 based on the adjusted fine codes FI<0:2> and FR<0:2> (at S830). The operations from S830 to S850 are iteratively performed until the fine codes FI<0:2> and FR<0:2> are fully counted, i.e., any of the fine codes FI<0:2> and FR<0:2> reaches the maximum count value, as all-zero values or all-high values. When any of the fine codes FI<0:2> and FR<0:2> reaches the maximum count value in a state that the output signal OUT has a voltage level out of the target range ("YES" of S860), the offset control circuit 125 may reset the fine codes FI<0:2> and FR<0:2>, and adjust the coarse codes CI<0:2> and CR<0:2>, according to the first and second judge signals COMP_OUT1 and COMP_OUT2 (at S870).

Referring to FIG. 10, when both of the first judge signal COMP_OUT1 and the second judge signal COMP_OUT2 have logic high levels (at S1010), the offset control circuit 125 may adjust the coarse codes CI<0:2> and CR<0:2> to increase the drivability of the first input transistor M1 while decreasing the drivability of the second input transistor M2, thereby lowering the voltage level of the output signal OUT (at S1020). In detail, the offset controller 310 generates the first coarse control signal CCTRL1 to increase the first coarse code CI<0:2> and generates the second coarse control signal CCTRL2 to decrease the second coarse code CR<0:2>. The coarse counter 320 increases the first coarse code CI<0:2> while decreasing the second coarse code CR<0:2>, according to the first and second coarse control signals CCTRL1 and CCTRL2. The register 340 stores the first coarse code CI<0:2> and the second coarse code CR<0:2> (at S1030).

When both of the first judge signal COMP_OUT1 and the second judge signal COMP_OUT2 have logic low levels (at S1040), the offset control circuit 125 may adjust the coarse codes CI<0:2> and CR<0:2> to decrease the drivability of the first input transistor M1 while increasing the drivability of the second input transistor M2, thereby increasing the voltage level of the output signal OUT (at S1050). In detail, the offset controller 310 generates the first coarse control signal CCTRL1 to decrease the first coarse code CI<0:2> and generates the second coarse control signal CCTRL2 to increase the second coarse code CR<0:2>. The coarse counter 320 decreases the first coarse code CI<0:2> while increasing the second coarse code CR<0:2>, according to the first and second coarse control signals CCTRL1 and CCTRL2. The register 340 stores the first coarse code CI<0:2> and the second coarse code CR<0:2> (at S1030).

Referring back to FIG. 8, the offset control circuit 125 may adjust again the fine codes FI<0:2> and FR<0:2>, according to the first and second judge signals COMP_OUT1 and COMP_OUT2 (at S850). The offset control circuit 125 may adjust again the fine codes FI<0:2> and FR<0:2>, as described in FIG. 9. Thereafter, the first and second judge signals COMP_OUT1 and COMP_OUT2 are generated by the comparison circuit 124 based on the adjusted coarse codes CI<0:2> and CR<0:2>, and the adjusted fine codes FI<0:2> and FR<0:2> (at S830). The operations from S830 to S850 are iteratively performed again until the fine codes FI<0:2> and FR<0:2> are fully counted. When the output signal OUT has a voltage level within the target range ("YES" at S840), the offset control circuit 125 may terminate the calibration operation.

On the contrary, when any of the fine codes FI<0:2> and FR<0:2> reaches again the maximum count value in a state that the output signal OUT has a voltage level out of the target range ("YES" at S860), the offset control circuit 125 may reset again the fine codes FI<0:2> and FR<0:2>, and may adjust again the coarse codes CI<0:2> and CR<0:2>, according to the first and second judge signals COMP_OUT1 and COMP_OUT2 (at S870). After the operations from S830 to S870 are iteratively performed again until the output signal OUT has a voltage level within the target range.

Thereafter, the calibration enable signal CAL_EN is disabled to exit the calibration mode. During a normal operation, the drivability of each of the first and second input transistors M1 and M2 may be adjusted according to the coarse codes CI<0:2> and CR<0:2> and the fine codes FI<0:2> and FR<0:2>, which are finally stored in the register 340, thereby compensating for the offset of the differential input circuit.

As set forth above, according to the embodiments, the semiconductor device may compensate for an offset of the differential input circuit through first to third calibration operations, such as a fine calibration, a coarse calibration, and a fine calibration. Thus, the semiconductor memory device may prevent deterioration of characteristics of the differential input circuit and allow a normal operation thereof.

It should be noted that although the technical spirit of the disclosure has been described in connection with preferred embodiments thereof, this is merely for description purposes and should not be interpreted as limiting. It should be appreciated by one of ordinary skill in the art that various changes may be made thereto without departing from the technical spirit of the disclosure.

For example, for the logic gates and transistors provided as examples in the above-described embodiments, different positions and types may be implemented depending on the polarity of the input signal.

While the present teachings have been illustrated and described with respect to the specific embodiments, it will be apparent to those skilled in the art in light of the present disclosure that various changes and modifications may be made without departing from the spirit and scope of the disclosure as defined in the following claims.

What is claimed is:

1. A semiconductor device, comprising:
    a differential input circuit suitable for receiving first and second input signals respectively inputted to first and second input transistors, and outputting an output signal;
    a comparison circuit suitable for generating a first judge signal by comparing the output signal with a first comparison voltage, and generating a second judge signal by comparing the output signal with a second comparison voltage, in a calibration mode;
    an offset control circuit suitable for adjusting coarse codes and fine codes, according to the first and second judge signals; and
    an offset adjusting circuit suitable for adjusting a drivability of each of the first and second input transistors by a first strength, according to the coarse codes, and adjusting the drivability of each of the first and second input transistors by a second strength smaller than the first strength, according to the fine codes.

2. The semiconductor device of claim 1, wherein the offset control circuit maintains the coarse codes and the fine codes, when the first judge signal has a logic level different from that of the second judge signal.

3. The semiconductor device of claim 1, wherein the offset control circuit adjusts the coarse codes and the fine codes to increase the drivability of the first input transistor while decreasing the drivability of the second input transistor, when both of the first and second judge signals have logic high levels.

4. The semiconductor device of claim 1, wherein the offset control circuit adjusts the coarse codes and the fine codes to decrease the drivability of the first input transistor while increasing the drivability of the second input transistor, when both of the first and second judge signals have logic low levels.

5. The semiconductor device of claim 1, wherein the offset control circuit includes:
    an offset controller suitable for generating counting control signals to increase or decrease the coarse codes and the fine codes, based on the first and second judge signals;
    a coarse counter suitable for increasing or decreasing the coarse codes according to the counting control signals;
    a fine counter suitable for increasing or decreasing the fine codes according to the counting control signals; and
    a register suitable for storing the coarse codes and the fine codes outputted from the coarse counter and the fine counter.

6. The semiconductor device of claim 5, wherein the offset controller generates the counting control signals by:
    generating fine control signals among the counting control signals, based on the first and second judge signals,
    determining, when any of the fine codes increased according to the fine control signals reaches a maximum count value, whether to generate coarse control signals among the counting control signals, and sequentially generating the coarse control signals and the fine control signals, according to a determination result.

7. The semiconductor device of claim 1, wherein the offset adjusting circuit includes:
a first coarse adjuster suitable for adjusting the drivability of the first input transistor by the first strength according to a first coarse code among the coarse codes;
a first fine adjuster suitable for adjusting the drivability of the first input transistor by the second strength according to a first fine code among the fine codes;
a second coarse adjuster suitable for adjusting the drivability of the second input transistor by the first strength according to a second coarse code among the coarse codes; and
a second fine adjuster suitable for adjusting the drivability of the second input transistor by the second strength according to a second fine code among the fine codes.

8. The semiconductor device of claim 7,
wherein the first coarse adjuster includes a plurality of first variable resistors coupled in parallel between a drain and a source of the first input transistor, and
wherein the first variable resistors include:
switches turned on in response to respective bits of the first coarse code, and
adjusting transistors having gates for receiving the first input signal in common and having resistance values different from each other.

9. The semiconductor device of claim 8,
wherein the first fine adjuster includes a plurality of second variable resistors coupled in parallel between a drain and a source of the first input transistor, and
wherein the second variable resistors include:
switches turned on in response to respective bits of the first fine code, and
adjusting transistors having gates for receiving the first input signal in common and having resistance values different from each other.

10. The semiconductor device of claim 9, wherein each of the adjusting transistors of the first variable resistors has a size greater than that of the adjusting transistors of the second variable resistors, and smaller than that of the first input transistor.

11. The semiconductor device of claim 1, further comprising:
a voltage generation circuit suitable for generating the first and second comparison voltages, and a calibration voltage;
an input control circuit suitable for providing the calibration voltage as both of the first and second input signals, in the calibration mode; and
an output control circuit suitable for providing the output signal outputted from the differential input circuit to the comparison circuit, in the calibration mode.

12. A calibration method of a differential input circuit for outputting an output signal by receiving first and second input signals respectively inputted to first and second input transistors, the calibration method comprising:
entering a calibration mode;
generating a first judge signal by comparing the output signal with a first comparison voltage, and generating a second judge signal by comparing the output signal with a second comparison voltage;
performing iterations each comprising:
performing iterations of adjusting fine codes according to the first and second judge signals and adjusting a drivability of each of the first and second input transistors by a second strength according to the adjusted fine codes; and
adjusting, when any of the adjusted fine codes reaches a maximum count value, coarse codes according to the first and second judge signals and adjusting the drivability of each of the first and second input transistors by a first strength greater than the second strength according to the adjusted coarse codes.

13. The calibration method of claim 12, further comprising:
determining whether the output signal has a voltage level with a target range according to the first and second judge signals, after adjusting the drivability of each of the first and second input transistors by the second strength; and
terminating the calibration mode when the output signal has the voltage level within the target range.

14. The calibration method of claim 13, wherein the voltage level of the output signal is determined to be within the target range when the first judge signal has a logic level different from that of the second judge signal.

15. The calibration method of claim 12, wherein each of the adjusting of the fine codes and the adjusting of the coarse codes includes increasing, when both of the first and second judge signals have logic high levels, the drivability of the first input transistor while decreasing the drivability of the second input transistor.

16. The calibration method of claim 12, wherein each of the adjusting of the fine codes and the adjusting of the coarse codes includes decreasing, when both of the first and second judge signals have logic low levels, the drivability of the first input transistor while increasing the drivability of the second input transistor.

17. The calibration method of claim 12, further comprising storing the coarse codes and the fine codes in a register.

18. The calibration method of claim 12, further comprising providing a calibration voltage as both of the first and second input signals.

19. The calibration method of claim 12, further comprising resetting the fine codes when any of the adjusted fine codes reaches the maximum count value.

20. A calibrator for calibrating a circuit configured to amplify differential inputs respectively through first and second transistors to generate an output, the calibrator comprising:
a voltage circuitry suitable for generating a target voltage range and a reference voltage provided as each of the differential inputs; and
a control circuitry suitable for adjusting, when the output is beyond the target voltage range, each drivability of the first and second transistors to cause the circuit to change the output,
wherein the control circuitry comprises a coarse adjuster circuit and a fine adjuster circuit connected together to one of the first and second transistors, and
the control circuitry adjusts the drivability through iterations each comprising iterations of fine adjustments made by the fine adjuster circuit and a coarse adjustment made by the coarse adjuster circuit to be performed when the fine adjustment of a current iteration reaches a fine adjustment limit.

* * * * *